United States Patent [19]

Opas et al.

[11] Patent Number: 5,608,761
[45] Date of Patent: Mar. 4, 1997

[54] METHOD, DEVICE, AND RADIO FOR COMPENSATING FOR MODULATOR FREQUENCY DRIFT WHILE ALLOWING FOR DATA TRANSMISSION

[75] Inventors: George F. Opas, Park Ridge; Robert J. DeGroot, Cary, both of Ill.

[73] Assignee: Motorola, Inc., Schaumburg, Ill.

[21] Appl. No.: 352,996

[22] Filed: Dec. 9, 1994

[51] Int. Cl.$^6$ ............... H04K 1/02; H04L 25/03; H04L 25/49
[52] U.S. Cl. ............ 375/296; 332/123; 455/126
[58] Field of Search ................ 375/296, 295; 332/123, 126, 117, 124, 127; 455/119, 126, 63, 46

[56] References Cited

U.S. PATENT DOCUMENTS

| | | | |
|---|---|---|---|
| 4,625,331 | 11/1986 | Richardson et al. | 455/35 |
| 5,012,208 | 4/1991 | Makinen et al. | 332/123 |
| 5,107,520 | 4/1992 | Karam et al. | 375/296 |
| 5,130,676 | 7/1992 | Mutz | 332/100 |
| 5,335,365 | 8/1994 | Ballantyne et al. | 455/76 |
| 5,396,196 | 3/1995 | Blodgett | 332/123 |

OTHER PUBLICATIONS

Thomas G. Xydis, "A Novel,Wide Band, Crystal Controlled FM Transmitter", Info/Card 89, Feb. 1991.
Daniel E. Fague, "Open Loop Modulation of VCOs for Cordless Telecommunications", Info/Card 21, Jul. 1994.

*Primary Examiner*—Stephen Chin
*Assistant Examiner*—Hai H. Phan
*Attorney, Agent, or Firm*—Darleen J. Stockley

[57] ABSTRACT

A method (100), a device (300), and a radio (500) are described for compensating for modulator frequency drift while allowing for data transmission in a half-duplex frequency modulated communication system. An adjustment is made to a premodulation signal in such a way that when it is passed through a frequency modulator to provide a transmitter excitation signal, frequency drift is corrected. Subsequent to determining a training command, the transmitter excitation signal passes through a switch to a demodulator. The demodulator output is averaged and used in the adjustment.

24 Claims, 4 Drawing Sheets

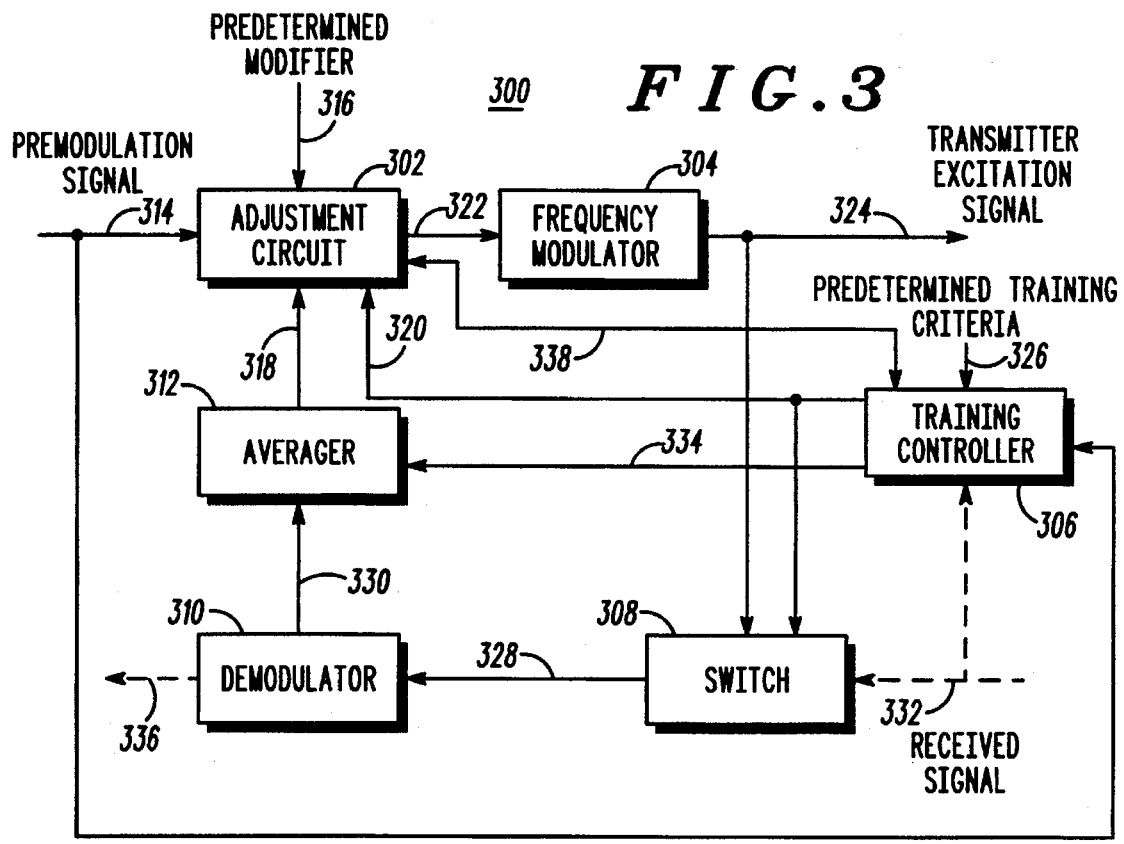
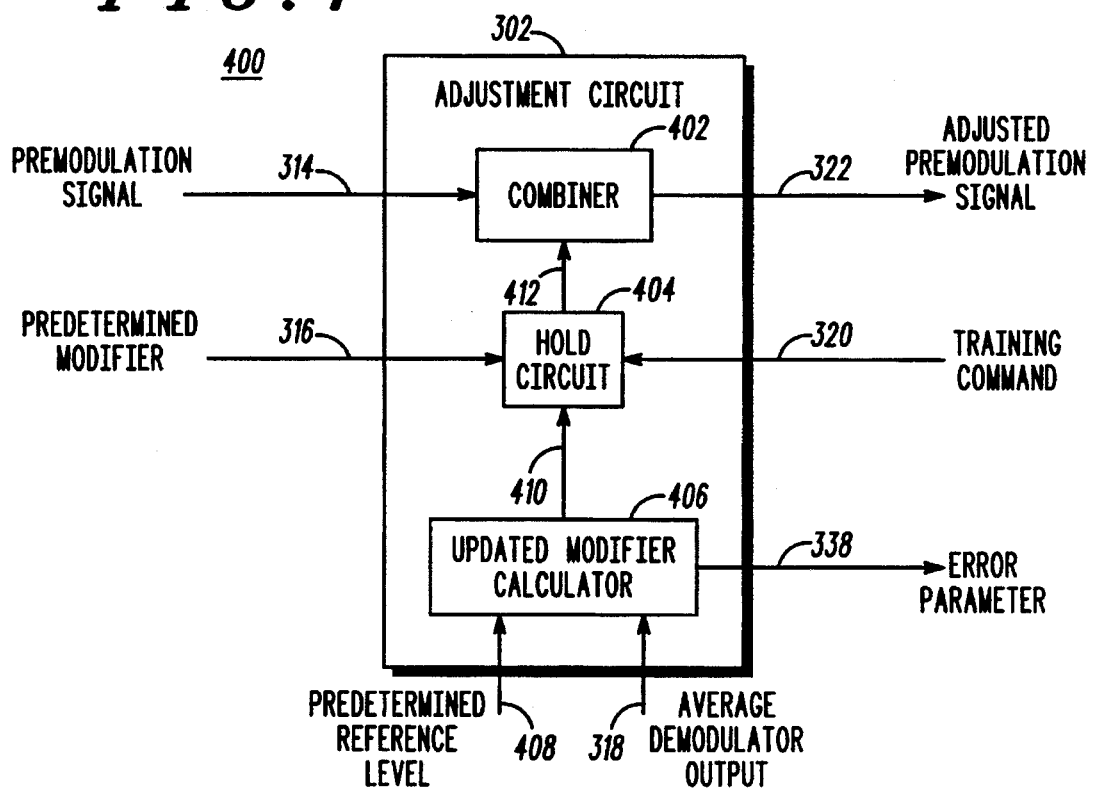

METHOD, DEVICE, AND RADIO FOR COMPENSATING FOR MODULATOR FREQUENCY DRIFT WHILE ALLOWING FOR DATA TRANSMISSION

FIELD OF THE INVENTION

The present invention relates generally to transmitter modulators used in half-duplex frequency modulated communication systems, and more particularly to compensating for modulator frequency drift while allowing for data transmission.

BACKGROUND OF THE INVENTION

A traditional method of generating constant-envelope frequency shift keyed, FSK, data modulation employs a phase-locked loop, PLL, to maintain the frequency of an associated voltage controlled oscillator, VCO, with its stability derived from the PLL's reference frequency. The PLL's frequency reference typically consists of a crystal oscillator. Data is applied to the VCO which then provides the FSK modulation. This method has the capability of sustaining fairly high levels of frequency deviation as compared to the older technique of direct frequency modulation of a crystal oscillator. This capability is important in moderate to high data rate systems where the frequency deviation is typically an appreciable fraction —e.g., 25%— of the data rate. In combination with a frequency offset transceiver architecture, the PLL is capable of accurate and stable operation over a wide range of operating frequencies.

A problem that commonly occurs with PLL modulators in data systems relates to the loop bandwidth. While data that has frequency content substantially above the loop bandwidth is able to modulate the VCO satisfactorily, if there is frequency content that falls inside the loop bandwidth—such as that which occurs with long strings of zeros or ones—destructive distortion of the data stream will take place which will render the data unrecoverable by an intended receiver. This issue has been addressed in various ways. Some methods employ a dual-port modulation scheme. This approach extends the PLL response towards direct current, DC, but never quite reaches it because of dynamic range limitations of some element of the loop. Other methods use complex schemes that read incoming data and reprogram loop dividers to achieve a DC response. Still other methods are reconciled to the high-pass response of the PLL frequency modulator and use data "whiteners" that randomize data to deal with long strings of zeros or ones, but still have to contend with vexatious patterns that frequently confound such attempts.

There exists, therefore, a need for a method, device, and radio for compensating for modulator frequency drift while allowing for data transmission, wherein the method and device is substantially less complex than prior art.

BRIEF DESCRIPTION OF THE DRAWINGS

FIG. 3 is a block diagram of one embodiment of a device which compensates for modulator frequency drift while allowing for simultaneous data transmission in accordance with the present invention.

FIG. 4 is a block diagram, shown with greater detail, of the adjusting circuit of FIG. 3 in accordance with the present invention.

DETAILED DESCRIPTION OF A PREFERRED EMBODIMENT

Generally, the present invention provides a method, device, and radio for compensating for modulator frequency drift while allowing for data transmission in a half-duplex frequency modulated communication system. An input signal is adjusted in such a way that, when passed through a frequency modulator to provide a transmitter excitation signal, frequency drift is negated. During frequency training, the transmitter excitation signal passes through a switch to a demodulator. The demodulator output is averaged and used in the original adjustment. With such a method and system, frequency drift is compensated with much less complexity compared to previous techniques.

Figure 1:
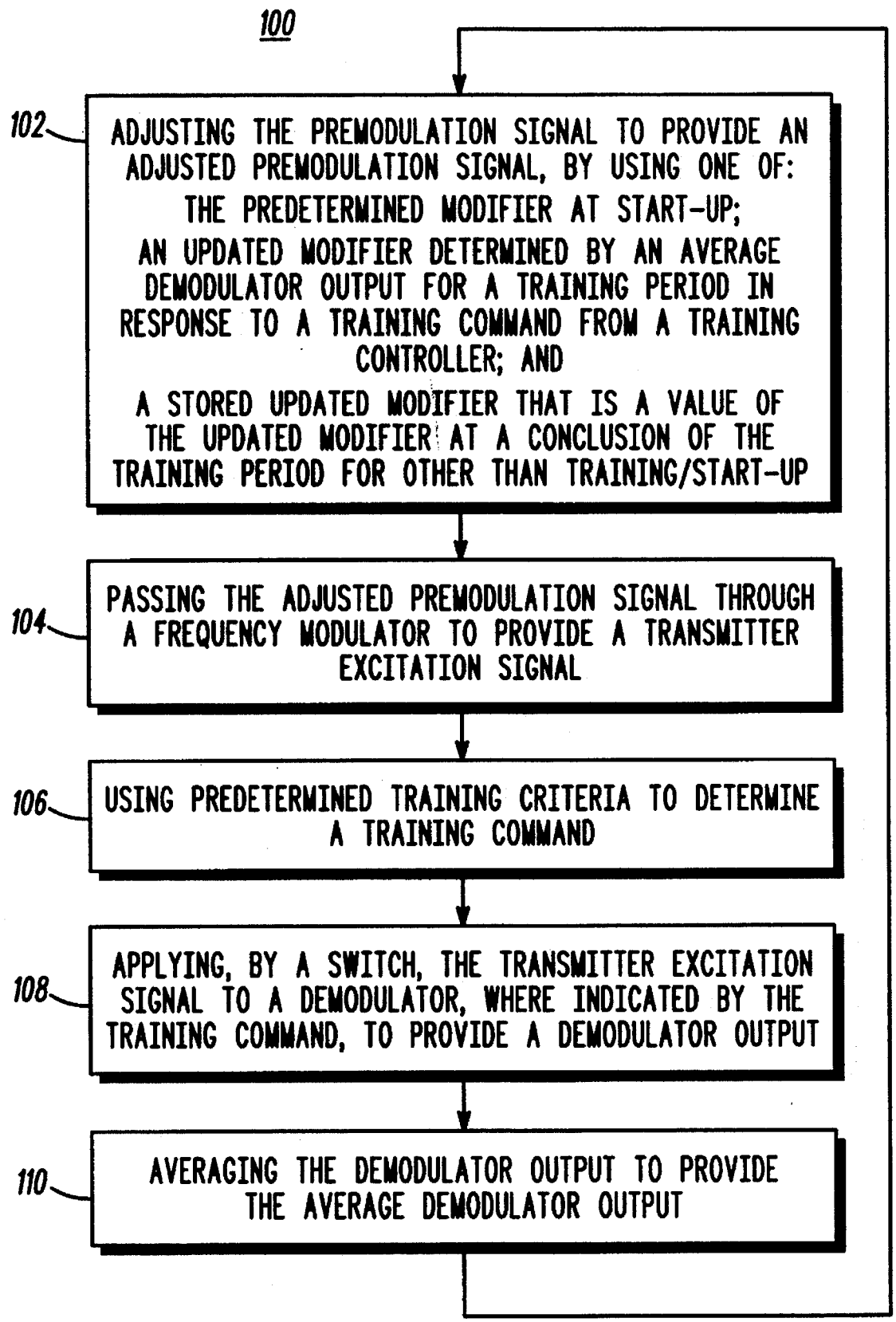
FIG. 1 is a flow diagram of one embodiment for implementing a method for compensating for modulator frequency drift while allowing for data transmission in accordance with the present invention.

The present invention is more fully described in FIGS. 1–4. FIG. 1, numeral 100, is a flow diagram of one embodiment for implementing a method of compensating for modulator frequency drift according to the present invention. The modulator in this case is a frequency modulator and consists of a free-running signal-controlled oscillator with an external terminal for controlling its frequency. Examples of signal-controlled oscillators are a voltage controlled oscillator, a current controlled oscillator, and an optically controlled oscillator. The voltage controlled oscillator (VCO) is the most common. By itself, a VCO is intrinsically capable of being modulated by a wide range of frequencies including DC—which is the desired behavior. The VCO is, however, also subject to operating frequency drift which would make its use unsuitable for many applications. To solve this problem, the input which carries the information to the modulator, which is called the premodulation signal, is adjusted by a modifier applied through a combiner to form an adjusted premodulation signal (102). The adjustment can also be made in the absence of data. Where the modulator has sufficient frequency tuning range available through its external control terminal, the overall effect of passing the adjusted premodulation signal through the frequency modulator (104) is the provision of the transmitter excitation signal which is the required frequency modulation spectrum with a center frequency that is sufficiently adjustable by means of the modifier to compensate for any frequency drift encountered from the modulator. The training period is initiated by a training command in response to several predetermined variables satisfying the training criteria (106). The predetermined variables may be a specific elapsed time since the last training period, the physical hardware changing temperature a specific amount, the absence of a received signal in implementations where the aforementioned demodulator additionally serves in a receiver function, or any other user-defined training schemes. The training controller accepts and processes the variables related to the training criteria and issues a training command when the criteria are met. The training command, in addition to initiating the training period, simultaneously closes a switch (108) to apply the transmitter excitation signal to the demodulator to provide the demodulator output. The demodulator output is then averaged (110) to provide an average demodulator output which pertains to a measure of the average of the signal applied to the demodulator.

There are three types of modifiers used to form the adjusted premodulation signal (102). A predetermined modifier is used at startup and may, for example, be a factory-set level that places the frequency modulator operating frequency at a convenient nominal value as a starting point for further updating. Alternatively, the predetermined modifier may be determined by the temperature of the physical hardware referencing a lookup table. An updated modifier is used during a training period in response to a training command from the training controller and is determined by the average demodulator output. A stored updated modifier is used for a majority of the time in the normal operation of the transceiver, is the value of the updated modifier at the conclusion of the training period, and is the value that tunes the modulator to the desired frequency of operation.

Figure 2:
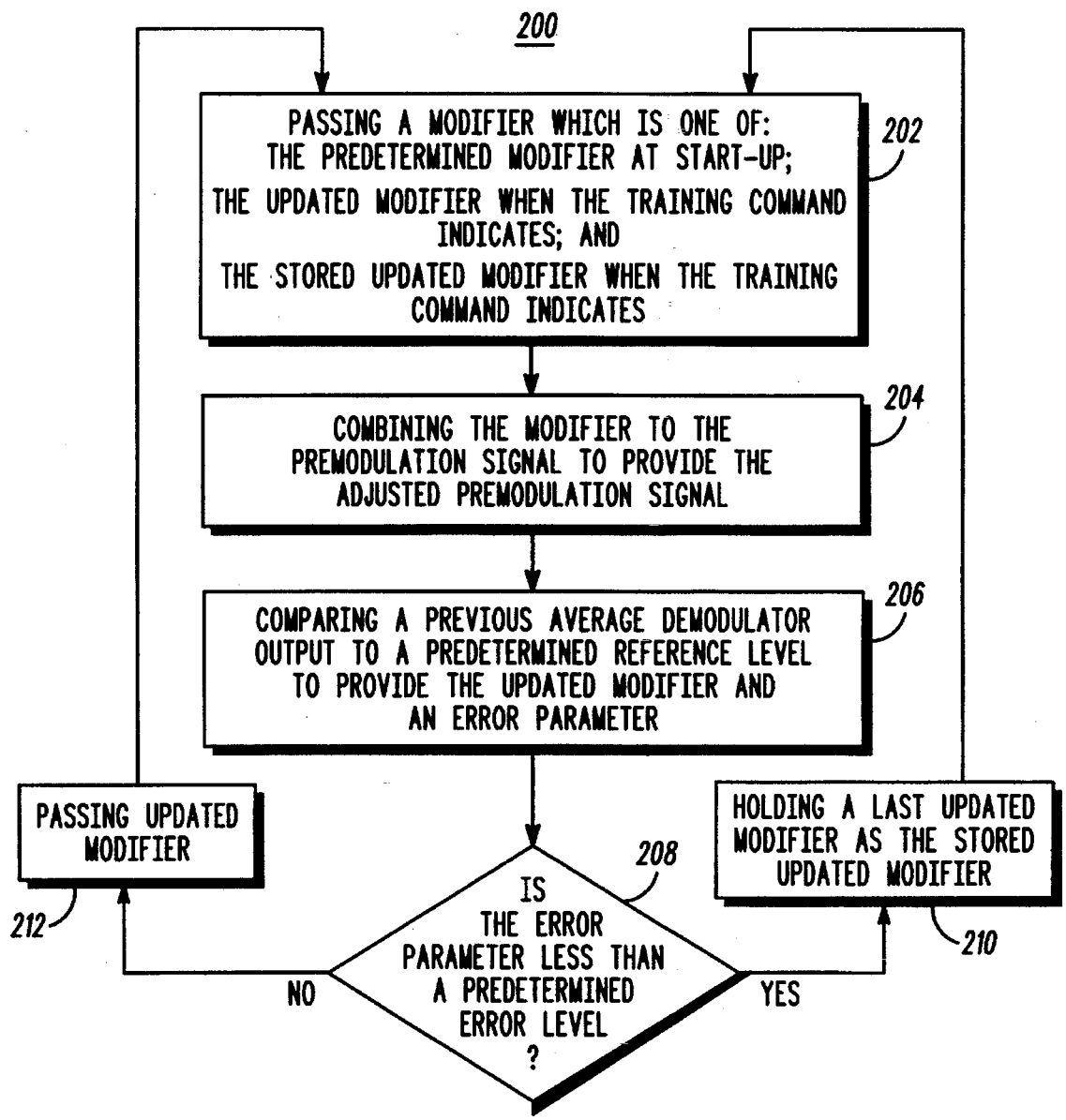
FIG. 2 is a flow diagram, shown with greater detail, of the step of adjusting the premodulation signal of FIG. 1 in accordance with the present invention.

FIG. 2, numeral 200, is a flow diagram, shown with greater detail, of the step of adjusting the premodulation signal of FIG. 1 in accordance with the present invention. A modifier is the predetermined modifier at start-up, the updated modifier when the training command indicates, or the stored updated modifier when the training command indicates (202). The modifier is held and is combined with the premodulation signal to provide the adjusted premodulation signal (204). When a training period is initiated by a training command from the training controller, the updated modifier and an error parameter are provided by comparing the average demodulator output to a predetermined reference level (206). The error parameter is compared to a predetermined error level (208). If the error parameter is greater than or equal to the predetermined error level, the updated modifier is held and passed to the combiner and the training period continues (212). Typically the modifier will be an incremental DC offset that is added to the premodulation signal with a summing circuit. The center frequency of the frequency modulator will change due to the adjustment to the premodulation signal. The average demodulator output is again compared to a predetermined reference level to provide a new value of the updated modifier. Several sequential values of the updated modifier may be generated in any particular training period as the modulator compensation method converges to provide a minimal error between the average demodulator output and the desired reference. This will cause the center frequency of the frequency modulator to be within a known maximum error of a desired reference frequency. Since the modifier is held constant when combined with the premodulation signal, the low pass response of a PLL is avoided and DC transmission is possible. If the error parameter is less than the predetermined error level, the last updated modifier is held as the stored updated modifier (210) and the training period ends.

The predetermined reference level can additionally be updated with a lookup table indexed to a variable such as temperature or operating voltage if the reference of the demodulator is expected to change and the relationship is known.

FIG. 3, numeral 300, is a block diagram of one embodiment of a device which compensates for modulator frequency drift while allowing for simultaneous data transmission in accordance with the present invention. The device is comprised of an adjustment circuit (302), a frequency modulator (304), a training controller (306), a switch (308), a demodulator (310), and an averager (312).

The adjustment circuit (302) receives the premodulation signal (314) and, based on a training command (320) from the training controller (306), applies either a predetermined modifier (316), an updated modifier, or a stored updated modifier to provide an adjusted premodulation signal (322). This device operates with the premodulation signal being either transmitted data or the absence of transmitted data— i.e., a quiet period. The adjusted premodulation signal (322) is passed through the frequency modulator (304) to provide a transmitter excitation signal (324). The frequency modulator (304) typically is one of the following signal-controlled oscillators: a voltage controlled oscillator, a current controlled oscillator, or an optically controlled oscillator. The training controller (306) receives and uses training criteria (326) and where selected, a received signal (332), to determine when to send the training command (320) to the switch (308) and to the adjustment circuit (302). The training controller would typically be a microprocessor or digital signal processor that controls the functions of the overall radio. The switch (308) passes the transmitter excitation signal (324) to the demodulator (310) when indicated by the training command (320). The demodulator (310) uses the switched transmitter excitation signal (328) to provide a demodulator output (330). The averager (312) receives the demodulator output (330) and the bits indicator signal (334) from the training controller (306). The averager (312) may include a maximum peak detector and a minimum peak detector. When data is present on the premodulation signal (314), the demodulator output (330) will not be a constant value, but will have positive and negative swings about its mean due to the positive and negative frequency deviations about the frequency modulator's (304) center frequency resulting from the data modulation. The peak detectors will capture the peak values and average them to provide the average demodulator output (318). The peak detectors may be simple diode detector circuits, and the minimum and maximum peaks may be averaged with either a resistive network or an operational amplifier summer circuit. If the modulation format requires that extensive filtering be applied to the data, as with 0.2 Gaussian Minimum Shift Keying, GMSK, for example, sufficient time must be allowed to ensure that a sufficient number of data bits are sequentially all 'zeros' and all 'ones'. The training controller (306) monitors the premodulation signal (314) and indicates to the averager (312) with the bits indicator signal (334) when a sufficient number of data bits are sequentially all 'zeros' and all 'ones'. This permits the data filter and any other filtering present in the demodulator to settle, and the peak detectors then return values corresponding to maximum negative and positive deviation about the center frequency of the modulator. When data is not present on the premodulation signal (314), the demodulator output (330) is a steady value representing the frequency modulator's (304) center frequency and the maximum and minimum peak detectors return the same value. The average demodulator output (318) is an input to the adjustment circuit (302).

The training period is initiated by a training command in response to several predetermined variables satisfying the training criteria (326). For example, the training criteria (326) may be based on an elapsed time since last training, a change in temperature, an absence of received signal, or a user determined training scheme. The temperature change can be detected with a thermistor monitored by the training controller. The demodulator (310) may be coupled to receive the received signal (332) for data recovery when the device is not being trained. In this case, the training controller may look for an absence of received signal before initiating the training period so that incoming data is not lost.

FIG. 4, numeral (400), is a block diagram, shown with greater detail, of the adjusting circuit for FIG. 3 in accordance with the present invention. The adjusting circuit (302) comprises an updated modifier calculator (406), a hold circuit (404), and a combiner (402).

The updated modifier calculator (406) compares the average demodulator output (318) to a predetermined reference level (408) to provide the updated modifier (410) and also an error parameter (338) that is read by the training controller. The updated modifier (410) is increased when the average demodulator output (318) is less than the predetermined reference level (408) and decreased when the average demodulator output (318) is greater than the predetermined reference level (408). The hold circuit (404) passes the predetermined modifier (316) to the combiner at start-up. If the error parameter read by the training controller is not minimal, the training controller signals the hold circuit to pass the updated modifier to the combiner. If the error parameter is minimal, the training controller signals the hold circuit to hold the updated modifier as the stored updated modifier. The hold circuit may be a digital-to-analog converter (DAC). The combiner (402) combines the modifier (412) with the premodulation signal (314) to provide the adjusted premodulation signal (322). The predetermined modifier (316) may be a factory-set level. The updated modifier is based on the average demodulator output (318). The stored updated modifier is a value of the updated modifier at the conclusion of a training period.

Figure 5:
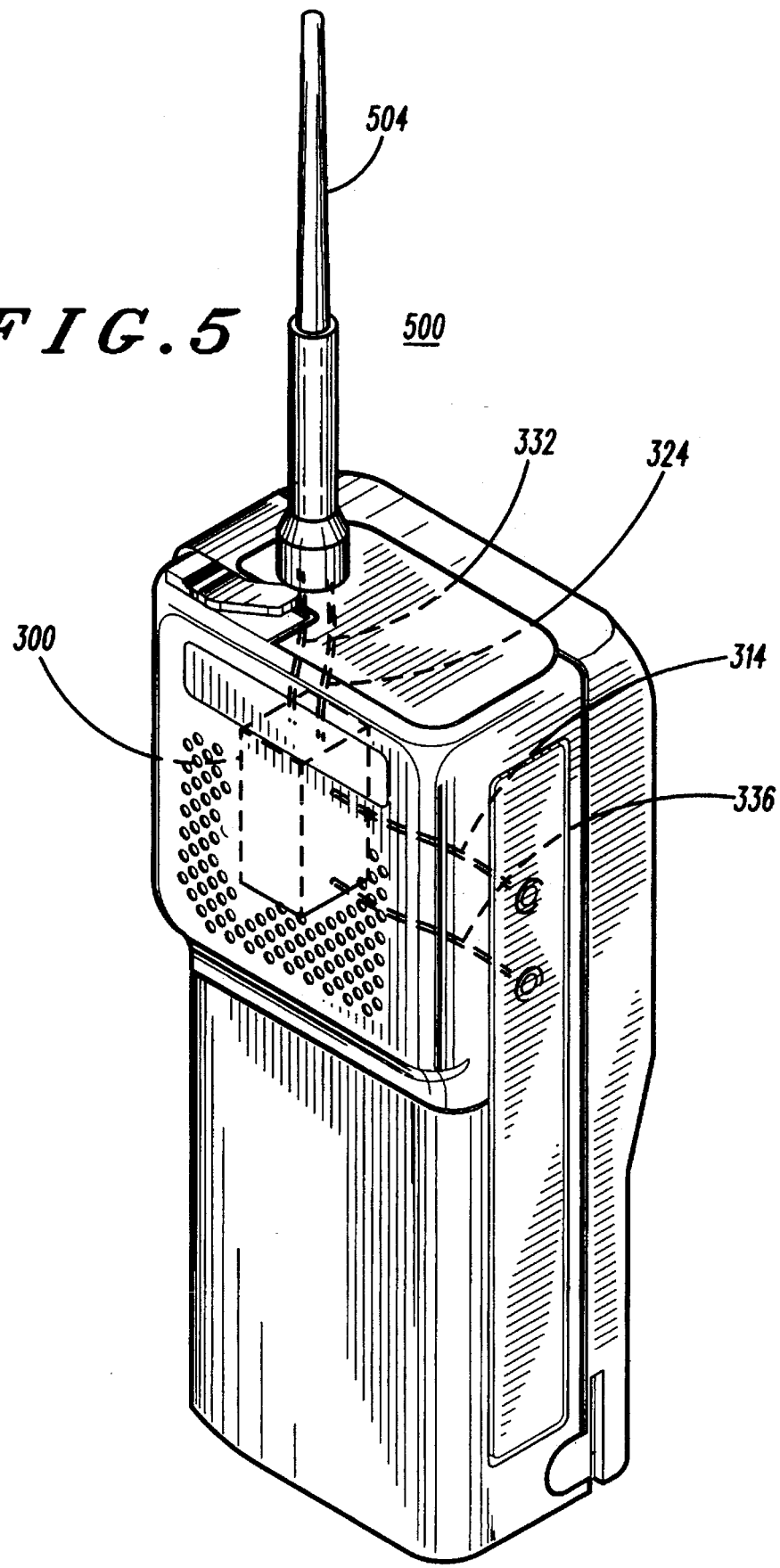
FIG. 5 is a diagram of one embodiment of a radio utilizing a device which compensates for modulator frequency drift while allowing for data transmission in accordance with the present invention.

FIG. 5, numeral 500, is a diagram of one embodiment of a radio (502) utilizing a device (300) which compensates for modulator frequency drift while allowing for data transmission in accordance with the present invention. The device (300) receives the premodulation signal (314) and provides an antenna (504) with the transmitter excitation signal (324). The device (300) also receives the received signal (332) to produce the demodulated received signal (336). In addition to producing the demodulated received signal (336), the device (300) efficiently uses the demodulator (310 in FIG. 3) to produce the demodulator output (330 in FIG. 3) to compensate for modulator frequency drift while allowing for data transmission. The efficiency of the device is desirable since the present invention provides a reduced radio size, an important customer satisfaction feature.

Thus, the present invention provides a method, device, and radio for compensating for modulator frequency drift while allowing for data transmission. An input signal is adjusted in such a way that when it is passed through a frequency modulator to provide a transmitter excitation signal, frequency drift is negated. During training, the transmitter excitation signal passes through a switch to a demodulator. The demodulator output is averaged and used in the original adjustment. With such a method, device, and radio a frequency drift is compensated for with much less complexity compared to previous techniques.

The method of the present invention compensates for modulator frequency drift in a half-duplex frequency modulated communication system that uses a premodulation signal, a received signal, predetermined training criteria, and a predetermined modifier. The method may be described to include the steps of: A) adjusting the premodulation signal to provide an adjusted premodulation signal, by using one of: A1) the predetermined modifier at start-up; A2) an updated modifier determined by an average demodulator output for a training period in response to a training command from a training controller; and A3) a stored updated modifier that is a value of the updated modifier at a conclusion of the training period for other than training/start-up; B) passing the adjusted premodulation signal through a frequency modulator to provide a transmitter excitation signal; C) using predetermined training criteria to determine a training command; D) applying, by a switch, where indicated by the training command, the transmitter excitation signal to a demodulator to provide a demodulator output; and E) averaging the demodulator output to provide the average demodulator output. Clearly, the device and radio implementing the present invention also may produce the adjusted premodulation signal at any one of the three stages shown above.

Although exemplary embodiments are described above, it will be obvious to those skilled in the art that many alterations and modifications may be made without departing from the invention. Accordingly, it is intended that all such alterations and modifications be included within the spirit and scope of the invention as defined in the appended claims.

We claim:

1. A method for compensating for modulator frequency drift in a half-duplex frequency modulated communication system that uses a premodulation signal, a received signal, predetermined training criteria, and a predetermined modifier, the method comprising the steps of:

A) adjusting the premodulation signal to provide an adjusted premodulation signal, by using one of:
   A1) the predetermined modifier at start-up;
   A2) an updated modifier determined by an average demodulator output for a training period in response to a training command from a training controller; and
   A3) a stored updated modifier that is a value of the updated modifier at a conclusion of the training period for other than training/start-up;

B) passing the adjusted premodulation signal through a frequency modulator to provide a transmitter excitation signal;

C) using predetermined training criteria to determine the training command;

D) applying, by a switch, where indicated by the training command, the transmitter excitation signal to a demodulator to provide a demodulator output; and E) averaging the demodulator output to provide the average demodulator output.

2. The method of claim 1, wherein the premodulation signal represents transmitted data.

3. The method of claim 1, wherein the premodulation signal represents an absence of transmitted data.

4. The method of claim 1, wherein step A) further comprises:

A) passing a modifier which is one of:
   A1) the predetermined modifier at start-up;
   A2) the updated modifier when the training command indicates; and
   A3) the stored updated modifier when the training command indicates;

B) combining the modifier with the premodulation signal to provide the adjusted premodulation signal;

C) comparing a previous average demodulator output to a predetermined reference level to provide the updated modifier and an error parameter; and D) determining whether the error parameter is less than a predetermined error level and one of:
   D1) holding a last updated modifier as the stored updated modifier when the error parameter is less than the predetermined error level; and
   D2) passing the updated modifier when the error parameter is greater than or equal to the predetermined error level.

5. The method of claim 4, wherein the predetermined reference level is updated by a lookup table.

6. The method of claim 1, wherein the frequency modulator is a signal-controlled oscillator.

7. The method of claim 6, wherein the signal-controlled oscillator is one of:

A) a voltage controlled oscillator;

B) a current controlled oscillator; and

C) an optically controlled oscillator.

8. The method of claim 1, wherein the training criteria is based on at least one of:

A) an elapsed time since last training;

B) a change in temperature;

C) an absence of received signal; and

D) a user determined training scheme.

9. The method of claim 1, wherein averaging the demodulator output to provide the average demodulator output includes determining a maximum peak and a minimum peak.

10. A device for compensating for modulator frequency drift in a half-duplex frequency modulated communication system that uses a premodulation signal, a received signal, predetermined training criteria and a predetermined modifier, the device comprising:

A) an adjustment circuit, operably coupled to receive the premodulation signal and the predetermined modifier, for applying a modifier which is one of:
   A1) the predetermined modifier;
   A2) an updated modifier; and
   A3) a stored updated modifier;
to provide an adjusted premodulation signal based on a training command from a training controller;

B) a frequency modulator, operably coupled to the adjustment circuit, for using the adjusted premodulation signal to provide a transmitter excitation signal;

C) the training controller, operably coupled to the adjustment circuit and to receive predetermined training criteria, the premodulation signal, and where selected, the received signal, for providing the training command to a switch and to the adjustment circuit;

D) the switch, operably coupled to the frequency modulator and to the training controller, for passing the transmitter excitation signal to a demodulator where indicated by the training command;

E) the demodulator, operably coupled to the switch, for using the transmitter excitation signal to provide a demodulator output; and F) an averager, operably coupled to the demodulator and to the training controller, for averaging the demodulator output to provide an average demodulator output in response to the training command.

11. The device of claim 10 wherein the demodulator is further coupled to receive the received signal for data recovery.

12. The device of claim 10, wherein the premodulation signal represents transmitted data.

13. The device of claim 10, wherein the premodulation signal represents an absence of transmitted data.

14. The device of claim 10, wherein the adjusting circuit further comprises:

A) an updated modifier calculator, operably coupled to receive a predetermined reference level and the average demodulator output, for comparing the average demodulator output to the predetermined reference level to provide the updated modifier;

B) a hold circuit, operably coupled to the updated modifier calculator and to receive the predetermined modifier and the training command, for holding and passing a modifier which is one of:
   B1) the predetermined modifier at start-up;
   B2) the updated modifier when the training command indicates; and
   B3) the stored updated modifier when the training command indicates;

C) a combiner, operably coupled to the hold circuit and to receive the premodulation signal, for combining the modifier with the premodulation signal to provide the adjusted premodulation signal.

15. The device of claim 14, wherein the predetermined reference level is updated by a lookup table.

16. The device of claim 10, wherein the frequency modulator is a signal-controlled oscillator.

17. The device of claim 16 wherein the signal-controlled oscillator is one of:

A) a voltage controlled oscillator;

B) a current controlled oscillator; and

C) an optically controlled oscillator.

18. The device of claim 10, wherein the training criteria is based on at least one of:

A) an elapsed time since last training;

B) a change in temperature;

C) an absence of received signal; and

D) a user determined training scheme.

19. The device of claim 10, wherein the predetermined modifier is a factory-set level.

20. The device of claim 10, wherein the predetermined reference level is compared to the average demodulator output and the updated modifier is one of:

A) increased when the average demodulator output is less than the predetermined reference level; and B) decreased when the average demodulator output is greater than the predetermined reference level.

21. The device of claim 10, wherein the stored updated modifier is a value of the updated modifier at a conclusion of a training period.

22. The device of claim 10, wherein the averager includes a maximum peak detector and a minimum peak detector.

23. The device of claim 10, wherein the training controller provides a bits indicator signal which is utilized by the averager.

24. A radio having a device for compensating for modulator frequency drift in a half-duplex frequency modulated communication system, the device comprising:

A) an adjustment circuit, operably coupled to receive a premodulation signal and a predetermined modifier, for applying a modifier which is one of:
   A1) the predetermined modifier;
   A2) an updated modifier; and
   A3) a stored updated modifier;
to provide an adjusted premodulation signal based on a training command from a training controller;

B) a frequency modulator, operably coupled to the adjustment circuit, for using the adjusted premodulation signal to provide a transmitter excitation signal;

C) the training controller, operably coupled to the adjustment circuit and to receive predetermined training criteria, the premodulation signal, and where selected, a received signal, for providing the training command to a switch and to the adjustment circuit;

D) the switch, operably coupled to the frequency modulator and to the training controller, for passing the transmitter excitation signal to a demodulator where indicated by the training command;

E) the demodulator, operably coupled to the switch, for using the transmitter excitation signal to provide a demodulator output; and F) an averager, operably coupled to the demodulator and to the training controller, for averaging the demodulator output to provide an average demodulator output in response to the training command.

* * * * *